United States Patent [19]

Kasper et al.

[11] Patent Number: 5,066,605
[45] Date of Patent: Nov. 19, 1991

[54] PROCESS OF PRODUCING MONOLITHICALLY INTEGRATED MULTIFUNCTION CIRCUIT ARRANGEMENTS

[75] Inventors: Erich Kasper, Pfaffenhofen; Maximilian Kuisl, Ulm; Ulf König, Ulm; Johann F. Luy, Ulm, all of Fed. Rep. of Germany

[73] Assignee: Licentia Patent Verwaltungs-GmbH, Frankfurt am Main, Fed. Rep. of Germany

[21] Appl. No.: 341,205

[22] Filed: Apr. 21, 1989

[30] Foreign Application Priority Data

Apr. 23, 1988 [DE] Fed. Rep. of Germany ....... 3813836

[51] Int. Cl.⁵ .......................................... H01L 21/205
[52] U.S. Cl. ........................................ 437/51; 437/89; 437/90; 437/79; 437/99; 437/110; 437/196; 437/915; 437/970; 148/DIG. 29
[58] Field of Search ............. 437/51, 89, 90, 78, 437/79, 64, 203, 193, 31, 99, 108, 109, 970, 110, 915; 148/DIG. 26, DIG. 29

[56] References Cited

U.S. PATENT DOCUMENTS

| 4,462,847 | 7/1984 | Thompson et al. | 437/99 |
| 4,550,491 | 11/1985 | Depey | 437/31 |
| 4,624,863 | 11/1986 | Vora | 437/193 |
| 4,663,831 | 5/1987 | Birrittella et al. | 437/195 |
| 4,696,097 | 9/1987 | McLaughlin et al. | 437/193 |
| 4,935,375 | 6/1990 | Kasper et al. | 437/99 |

FOREIGN PATENT DOCUMENTS 0232516 12/1986 European Pat. Off.
0263756 4/1988 European Pat. Off.
P3813837 4/1988 Fed. Rep. of Germany.

OTHER PUBLICATIONS

Tang et al., "A Symmetrical Bipolar Structure" International Electron Devices Meeting, 1980, IEEE, pp. 58–60.
Marinace, "Semiconductor Fabrication", IBM Tech. Discl. Bul. vol. 3, No. 4, Sep. 1960, p. 42.
R. T. Tung et al., "Formation of Ultrathin Single-Crystal Silicide Films on Si: Surface and Interfacial Stabilization of Si-NiSi₂ Epitaxial Structures", Physical Review Letters, vol. 50, No. 6, Feb. 1983, pp. 429–432.
Yoichi Akasaka et al., "Concept and Basic Technologies for 3-D-IC Structure", IEDM 86, 1986, pp. 488–491.

Primary Examiner—Brian E. Hearn
Assistant Examiner—Tuan Nguyen
Attorney, Agent, or Firm—Spencer & Frank

[57] ABSTRACT

A process for producing monolithically integrated multifunction circuit arrangements. A substrate having an integrated circuit formed therein is provided, and further multilayer semiconductor components and the corresponding electrical leads are arranged on top of one another on the substrate surface. The multilayer semiconductor components and the electrical leads are produced from an epitaxially grown semiconductor layer sequence.

11 Claims, 2 Drawing Sheets

PROCESS OF PRODUCING MONOLITHICALLY INTEGRATED MULTIFUNCTION CIRCUIT ARRANGEMENTS

REFERENCE TO RELATED APPLICATIONS

This application claims the priority of Federal Republic of Germany application Ser. No. P 38 13 836.0 filed Apr. 23rd, 1988, which is incorporated herein by reference.

BACKGROUND OF THE INVENTION

The present invention relates to a process for producing monolithically integrated multifunction circuit arrangements composed of at least one integrated circuit formed in a monocrystalline semiconductor substrate and at least one multilayered semiconductor component formed on the surface of the substrate.

The invention is employed in the manufacture of three-dimensional semiconductor circuits. It is particularly suitable for the construction of integrated mm wave circuits and Si microwave circuits (Si-MMIC's).

In the past, multifunction circuit arrangements were produced in two-dimensional, integrated or hybrid configurations. This has the drawback that coupling losses develop between the individual components of the circuit. The manufacture of conventional hybrid and integrated multifunction circuit arrangements is cost-intensive and the two-dimensional structure requires a large amount of space. The leads between the active and/or passive components disposed in different planes are made of metal or metal-semiconductor compounds.

SUMMARY OF THE INVENTION

It is therefore an object of the present invention to provide a process for producing multifunction circuit arrangements in which selective epitaxy processes are employed to produce, in an economical manner, three-dimensional circuit arrangement of high packing density employing short, low-loss electrical leads.

The above object is basically achieved according to the present invention by a process for producing a monolithically integrated multifunction circuit arrangement composed of at least one integrated circuit integrated in a monocrystalline semiconductor substrate and at least one multilayer semiconductor component disposed on the substrate, which process includes the steps of:

providing a monocrystalline semiconductor substrate having an integrated circuit formed therein adjacent one major surface and a passivating layer covering the major surface;
 forming at least one window for a contact zone and at least one further window for a multilayered semiconductor component in the passivating layer above selected respective regions of the integrated circuit extending to the major surface of the substrate,
 epitaxially growing a structured semiconductor layer sequence on at least the portions of the major surface of the substrate within the windows to provide a monocrystalline multilayer component in one of the windows and a monocrystalline vertical contact zone in one of the further windows: and, embedded simultaneously in polycrystalline semiconductor material,
 forming a conductive connection layer on top of --; the vertical contact zone and the multilayered component, and on top of the polycrystalline embodiment --; and whereby a planar, three-dimensional integrated circuit arrangement is formed.

According to one embodiment of the process, the monocrystalline semiconductor layers of the multilayered component and of the monocrystalline semiconductor vertical contact zone are simultaneously grown epitaxially. According to this embodiment, the epitaxially grown monocrystalline semiconductor vertical contact zone preferably is converted subsequently to a uniform conductivity type by an implantation and/or a diffusion process.

According to another embodiment of the invention, first the vertical contact zone or zones are formed by epitaxial growth through a window or windows in the passivating layer, and only then are the further window or windows in the passivation layer for the multilayered components formed, and the semiconductor layers for the multilayered component selectively epitaxially grown.

In the inventive process for producing a multifunction circuit arrangement, it is of advantage that semiconductor components and the integrated circuits required to control and/or amplify them as well as their electrical connections are produced from a common substrate and a semiconductor layer sequence grown thereon. A three-dimensional circuit arrangement results in which high packing density is realized for the semiconductor components. The circuits disposed in various planes of the three-dimensional circuit arrangement are electrically connected with the multilayer semiconductor components by means of contact layers and vertical monocrystalline contact zones. The structure of the components and the electrical leads are produced jointly in one epitaxy process. The electrical leads are composed in part of monocrystalline semiconductor material. Thus it is possible to form short, low-loss, electrical connections between the individual semiconductor components.

The multilayer semiconductor components may be integrated in the multifunction circuit arrangement in various ways. The multilayer semiconductor components may be disposed (a) on a highly doped semiconductor zone disposed in the substrate;
 (b) on a contact region of an active or passive component disposed in the substrate; and/or
 (c) on an electrically conductive layer of the semiconductor layer sequence configured as the electrical connection for the components in different planes of the three-dimensional circuit.

The integrated vertical contact zones required for the electrical connections between the components of the multi-function circuit arrangement may also be applied to (a) contact regions of active and passive components;
 (b) conductive semiconductor zones disposed in the substrate; and/or
 (c) electrically conductive layers of the semiconductor layer sequence.

The invention will be described below in greater detail for embodiments thereof and with reference to the schematic drawing figures.

DETAILED DESCRIPTION OF THE PREFERRED EMBODIMENTS

Figure 1A:
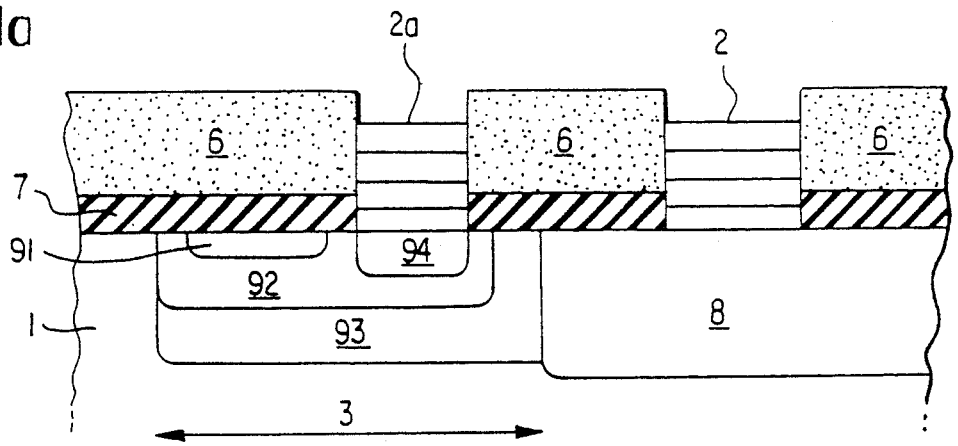
FIGS. 1a–1c are schematic sectional views showing the process steps for the production of a three-dimensional multifunction circuit according to one embodiment of the invention.
Figure 1B:
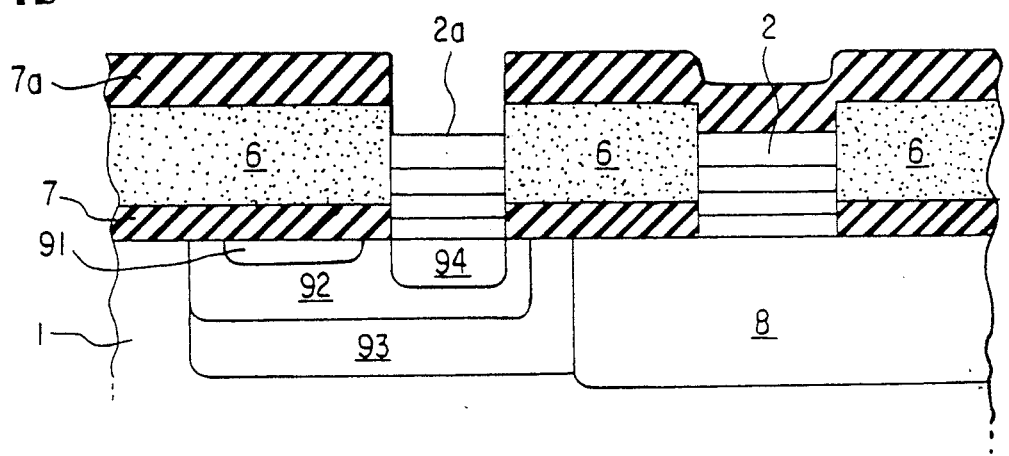
Figure 1C:
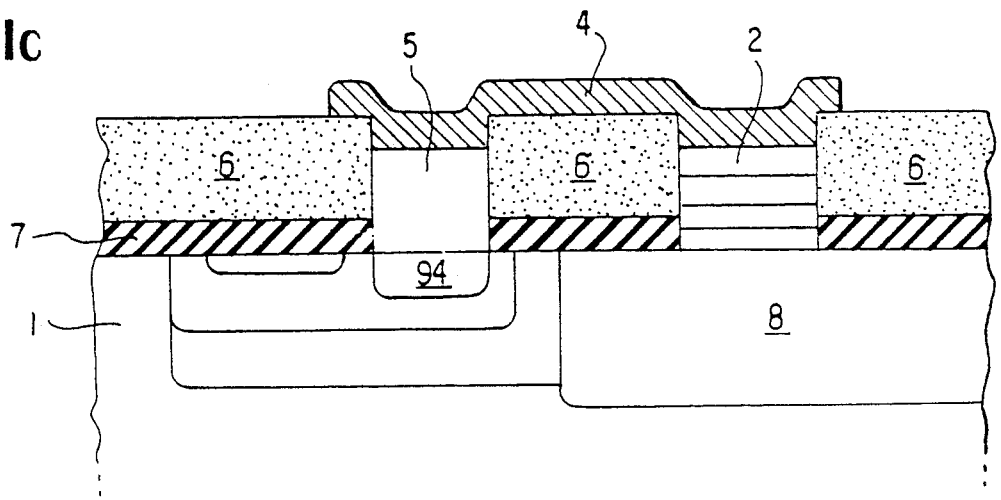

Referring now to FIGS. 1a-1c, there is shown a highly resistive monocrystalline substrate 1, composed of, for example, Si, having an integrated circuit, for example a bipolar transistor 3, formed therein. Bipolar transistor 3 is composed of an emitter region 91, a base region 92 provided with a base contact region 94, and a collector region 93, all integrated in the substrate 1. Collector region 93 is contacted conductively by a conductive semiconductor zone 8 formed in the major surface of the substrate 1. A first passivation layer 7, e.g. of flow glass or silicon dioxide, is applied to the major surface of the substrate 1 in order to flatten out any possible structural unevennesses in the substrate surface. Thereafter, as shown in FIG. 1a, by way of known photo and etching processes, windows are opened in the first passivation layer 7 so that regions of the underlying surface of substrate 1 to which a connection is to be made are exposed. For example, in FIG. 1a, windows are opened so that the base contact region 94 of bipolar transistor 3 and a partial region of the buried conductive semiconductor zone 8 are exposed.

Then, by means of an epitaxy process, particularly by means of molecular beam epitaxy, a plurality of successive semiconductor layers, for example Si layers, are deposited over the entire surface area of the first passivation layer 7 and of the exposed base contact region 94 as well as on the exposed region of the conductive semiconductor zone 8. Thus, monocrystalline semiconductor regions 2a and 2 are produced, respectively, on the monocrystalline base contact region 94 and on the monocrystalline, conductive semiconductor zone 8, and polycrystalline semiconductor regions 6 are produced on the first passivation layer 7 as shown in FIG. 1a. The doping of the respective epitaxially grown semiconductor layers must be selected so that, on the one hand, the polycrystalline region 6 becomes highly resistive and, on the other hand, the monocrystalline regions 2 and 2a are electrically conductive. Moreover, the doping is such that a multilayered semiconductor component, including layers of opposite conductivity types if necessary, is formed by the layer sequence 2.

After the successive epitaxial layer growth, as shown in FIGS. 1b, a second passivation layer 7a, e.g. of flow glass or photoresist, is applied over the entire surface area of the monocrystalline regions 2 and 2a and of the polycrystalline region 6, and a window is opened in the second passivation layer 7a above monocrystalline region 2a. Arsenic, or Phosphorous for example, then is implanted or diffused into the monocrystalline region 2a via this window to create a vertical contact zone 5 of a uniform conductivity type from the region 2a (see FIG. 1c) i.e., the contact zone 5 of uniform conductive type extends to the underlying base contact region 94. The conductivity of contact zone 5 changes in the vertical direction to correspond to known implantation or diffusion profiles. The resistance of the contact zone 5 can be set by selection of the implantation or diffusion dosage, the original doping of component structure 2a and the geometrical dimensions (height and cross section) of the contact zone 5.

Thereafter, as further shown in FIG. 1c, the second passivation layer 7a is removed wet chemical or by dry etching. Then, an electrically conductive layer 4 composed of a metal-semiconductor compound, e.g. NiSi$_2$, R. T. Tung, J. M. Gibson, J. M. Poate "Formation of Ultra-Thin Single-Crystal Silicide Films on Si: Surface and Interface Stabilization of Si-NiSi$_2$ Epitaxial Structures" PHYSICAL REVIEW LETTERS, Vol. 50, No. 6, Feb. 1983, pages 429-432), or of a pure metal is grown or evaporated in such a manner that a suitable electrical connection is produced on top of component 2 and vertical contact zone 5 (FIG. 1c). By repeating the process sequence of FIGS. 1a to 1c, further component structures 2 and vertical contact zones 5 are grown on top of one another.

Figure 2A:
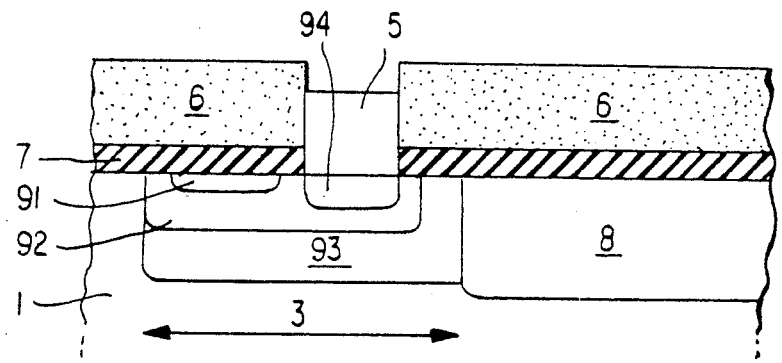
FIGS. 2a-2d are schematic sectional views showing the process steps for the production of a three-dimensional multifunction circuit according to a further embodiment of the invention.

A variation of the process for producing a three-dimensional multifunction circuit arrangement is shown in FIGS. 2a to 2d. Analogously to the above-described process, as shown in FIG. 2a a first passivation layer 7, for example, of flow glass or SiO$_2$, is applied to the surface of a substrate 1 of, for example, highly resistive monocrystalline Si which includes, for example, a bipolar circuit comprising at least one bipolar transistor 3. Emitter region 91, base region 92 with base contact region 94, and collector region 93 of bipolar transistor 3 are integrated in substrate 1. Collector region 93 is contacted by way of an electrically conductive semiconductor zone 8 that is buried or disposed in substrate 1 adjacent its major surface. Again analogously to the process of FIGS. 1a-1c, by means of known photo and etching processes, a window is opened in the first passivation layer 7, but only above base contact region 94 of bipolar transistor 3. By means of, for example, molecular beam epitaxy, a thick semiconductor layer, for example, of Si, is grown on the surface of the first passivation layer 7 and on the exposed surface of the base contact region 94. Polycrystalline regions 6 form on the first passivation layer 7 and a monocrystalline, vertical contact zone 5 grows on the monocrystalline base contact region 94. The doping of the vertical contact zone 5 and of the polycrystalline regions 6 is selected in such a manner that, on the one hand, a suitable resistance can be set in the contact zone 5 and, on the other hand, polycrystalline regions 6 become highly resistive.

Figure 2B:
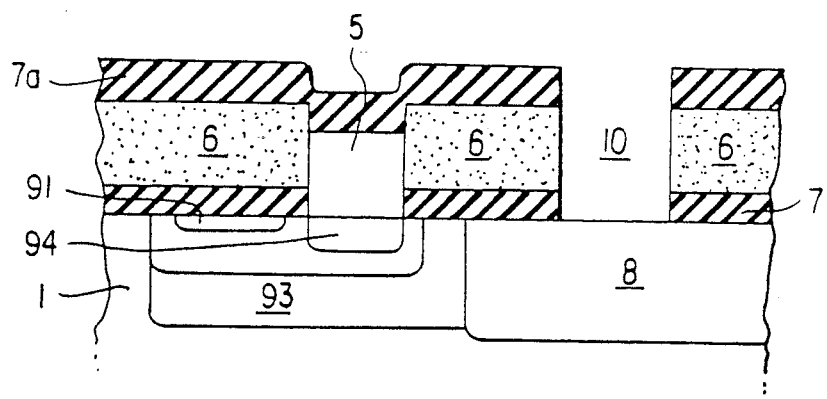
Figure 2C:
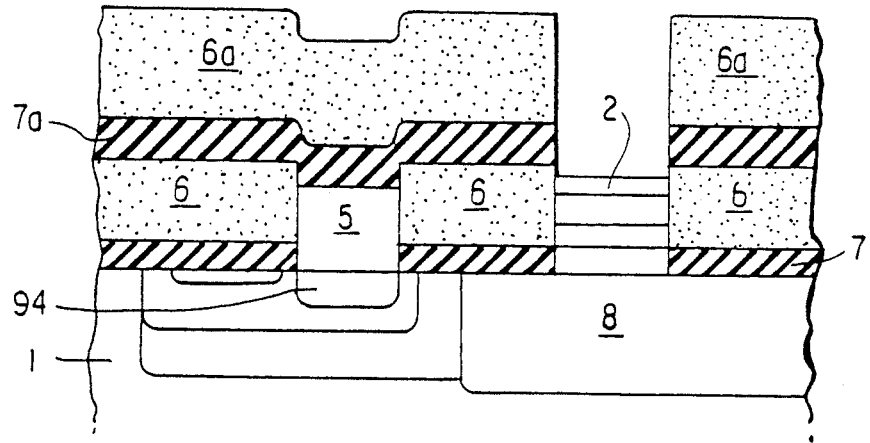
Figure 2D:
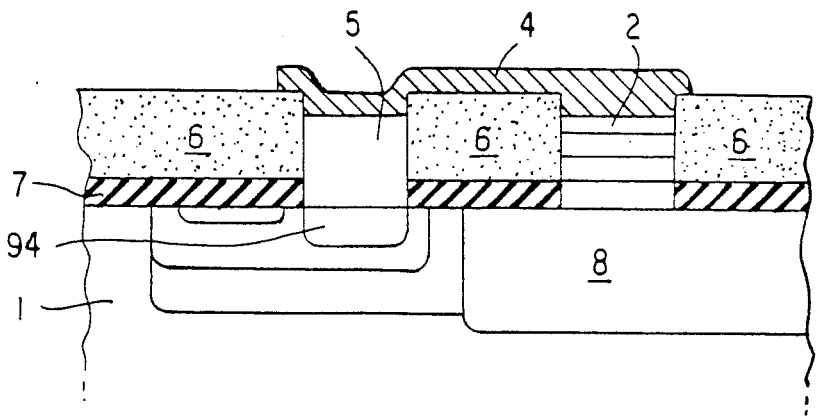

Thereafter, as shown in FIG. 2b, a second passivation layer 7a is applied over the entire surface area of contact zone 5 and polycrystalline regions 6. A window is then formed in the second passivation layer 7a and a trough 10 is etched into polycrystalline region 6 in a manner so that a portion of the surface of the electrically conductive semiconductor zone 8 which is buried in substrate 1 is exposed. Then, as shown in FIG. 2c, a sequence of semiconductor layers of a desired component structure are epitaxially grown in trough 10 on the exposed portion of region 8 and on the surface of the second passivation layer 7a. Polycrystalline regions 6a form on the surface of the second passivation layer 7a and a monocrystalline multilayer component 2 is produced in trough 10. Thereafter, as shown in FIG. 2d, by means of a so-called stripping process and underetching of the passivation layer 7a, the polycrystalline regions 6a and the passivation layer 7a are removed, and finally an electrically conductive layer 4 composed of a metal-semiconductor compound, e.g., NiSi$_2$, is grown on the polycrystalline regions 6 and on the monocrystalline regions 5 and 2 so that an electric lead is produced between vertical contact zone 5 and multilayer component 2. For example, the first passivation layer 7 is of 0.05 μm thin $SiO_2$. Windows opened in the first passivation layer 7 have a diameter of 10 μm. During a MBE process at 550° C., the monocrystalline semiconductor regions 2a, 2 are grown in the windows consisting of a layer sequence of an n type Si layer with a Sb doping of $1 \cdot 10^{18}$ cm$^{-3}$ and a layer thickness of 0.05 μm, a n type Si layer with a Sb doping of $5 \cdot 10^{16}$ cm$^{-3}$ and a layer thickness of 0.2 μm, and a p type Si layer with Ga doping of $1 \cdot 10^{18}$ cm$^{-3}$ and a thickness of 0.05 μm. Simultaneously, the polycrystalline region 6 grows on the first passivation layer 7 with a thickness of 0.5 μm corresponding to the total thickness of the four layers in the monocrystalline semiconductor region 2a. The doping in the polycrystalline region 6 is similar to the doping in the monocrystalline region 2a, but the resistivity of the polycrystalline region 6 is about six orders of magnitude higher than in the monocrystalline semiconductor region 2a and nearly independent of the different doping levels in the layer sequence. The second passivation layer 7a is a photoresist layer with a thickness of 1 μm. A window is opened above the monocrystalline semiconductor region 2a. Phosphorous is implanted with two energies of 80 KeV and 280 keV sufficiently high to penetrate through the total thickness of the monocrystalline semiconductor region 2a and to yield a low resistivity. A rapid thermal annealing process of 20 sec at 950° C. follows in order to activate the implanted species and to form the vertical contact zone 5. The deposition of the conductive layer 4 on top of the regions 5, 6 and 2 can be a conventional metallization process or a $NiSi_2$-process.

By repeating the process steps of FIGS. 2a–2d, further superposed multilayer components and corresponding contact zones and electrical leads are produced. The differential molecular beam epitaxy process as well as selective, reactive epitaxy processes, e.g. MOVPE (metal organic vapor phase epitaxy), are suitable for the production of the semiconductor layer sequence. These epitaxial processes allow working with low temperatures (300°–700° C.), which are sufficiently low to minimize thermal damage of the integrated circuit 3 in substrate 1 during the epitaxial deposition of the semiconductor layer sequence.

With suitable process conditions (e.g. subatmospheric pressure of 50 Torr for MOVPE) it becomes possible to prevent the formation of the polycrystalline regions 6a on the second passivation layer 7a and to grow monocrystalline semiconductor layers only in trough 10.

The process according to the invention is employed for the production of three-dimensional multifunction circuit arrangements which are disclosed, for example, in our Federal Republic of Germany patent application P 38 13 837 filed Apr. 23rd, 1988. Three-dimensional multifunction circuit arrangements for which the present invention can be utilized are presented by Y. Akasaka, T. Nishimura "Concept and Basic Technologies for 3-D- IC Structure", IEDM 86 (1986), pages 488–491.

The invention is not limited to the semiconductor structures and semiconductor materials named in the embodiments. For example, the substrate and the epitaxially grown semiconductor layers for a three-dimensional circuit may be produced from different semiconductor materials, for example Si, Ge, and III/V and II/VI semiconductor compounds. The circuit patterned in the substrate 1 need not to be a bipolar circuit but can also be a MOS-circuit. In this case the monocrystalline semiconductor region 2a can be arranged on top of the source contact and the contact region 5 on the drain contact or vice versa. Components can be stacked in different planes of the three dimensional circuit e.g., on top of the conduction layer 4 of $NiSi_2$ which grows monocrystalline on the monocrystalline regions 5, 2 and polycrystalline on the polycrystalline region 6. A further deposition of a multi-layer semiconductor sequence on top of the contact layer 4 yields additional active device areas over the monocrystalline semiconductor region 5, 2. (see for example the German patent application P 38 13 837).

Conductive layers on top of the monocrystalline semiconductor regions have to be disposed in an appropriate manner to interconnect several semiconductor components.

The invention now being fully described, it will be apparent to one of ordinary skill in the art that any changes and modifications can be made thereto without departing from the spirit or scope of the invention as set forth herein.

What is claimed is:

1. A process for producing monolithically integrated multifunction circuit arrangements composed of at least one integrated circuit integrated in a monocrystalline semiconductor substrate and at least one multilayer semiconductor component disposed on the substrate, said method including the steps of:

providing a monocrystalline semiconductor substrate having an integrated circuit formed therein adjacent one major surface and a passivating layer covering said one surface;

forming at least one window for a contact zone and at least one further window for a multilayered semiconductor component in said passivating layer above selected laterally separated respective connection regions of said integrated circuit extending to said one surface of said substrate.

epitaxially growing a structured semiconductor layer sequence on at least the portions of said one surface of said substrate within said windows to provide a monocrystalline multilayer component in one of said windows and a monocrystalline vertical contact zone in one of said further windows; and, forming a conductive connection layer on top of said vertical contact zone and said multilayered component, whereby a planar, three-dimensional integrated circuit arrangement is formed.

2. A process as defined in claim 1 wherein: said step of epitaxially growing further includes simultaneously growing polycrystalline semiconductor material on said passivation layer; and said conductive connection layer is disposed, at least partially, on said polycrystalline layer.

3. A process as defined in claim 2, wherein said step of epitaxially growing includes growing said monocrystalline layer sequence and said monocrystalline vertical contact zone to a height greater than a height of said passivation layer.

4. A process as defined in claim 1 wherein: said monocrystalline semiconductor layers of the multilayered component and said monocrystalline semiconductor vertical contact zone are simultaneously grown epitaxially.

5. A process as defined in claim 4 further comprising, after said step of epitaxially growing, converting the monocrystalline semiconductor vertical contact zones to a uniform conductivity type by at least one of an implantation and a diffusion process.

6. A process as defined in claim 1 wherein said steps of forming at least one window and of epitaxially growing include the following steps in sequence: forming only the window for the vertical contact zone; epitaxially growing the vertical contact zone; forming said further window in said passivation layer; and then selectively epitaxially growing the semiconductor layers for the multilayered component.

7. A process as defined in claim 6 further comprising: depositing a further passivation layer over at least said monocrystalline vertical contact zone prior to said step of forming said further window; forming said further window in said passivating layer and said further passivating layer; and removing said further passivating layer after said step of epitaxially growing the semiconductor layers for the multilayered component and before said step of forming a conductive connection layer.

8. A process as defined in claim 1 wherein the vertical contact zones are formed as almost resistance-free connections between the semiconductor components disposed in different planes.

9. A process as defined in claim 1 wherein the vertical contact zones are configured as resistors.

10. A process as defined in claim 1, wherein the vertical contact zones are produced of monocrystalline doped semiconductor material.

11. A process as defined in claim 1 wherein the electrically conductive connection layer is produced of a metal-semiconductor compound.

* * * * *